United States Patent [19]
Binet

[11] Patent Number: 5,198,754
[45] Date of Patent: Mar. 30, 1993

[54] TESTING APPARATUS FOR HIGH FREQUENCY INTEGRATED CIRCUIT CHIP

[75] Inventor: Michel J. M. Binet, Creteil, France

[73] Assignee: U.S. Philips Corporation, New York, N.Y.

[21] Appl. No.: 303,965

[22] Filed: Jan. 27, 1989

Related U.S. Application Data

[63] Continuation of Ser. No. 944,923, Dec. 18, 1986, abandoned.

[30] Foreign Application Priority Data

Dec. 20, 1985 [FR] France .................... 85 18921

[51] Int. Cl.$^5$ .................... G01R 1/04; G01R 31/28; G01R 31/02
[52] U.S. Cl. .................... 324/158 F; 333/33; 333/247; 333/254
[58] Field of Search .................... 324/158 F; 333/247, 333/246, 260, 21 R, 33, 34, 35, 254, 250

[56] References Cited
U.S. PATENT DOCUMENTS

| | | | |
|---|---|---|---|
| 3,775,644 | 11/1973 | Cotner et al. | 324/158 F X |
| 4,365,195 | 12/1982 | Stegens | 324/158 F |
| 4,535,307 | 8/1985 | Tsukii | 333/247 X |
| 4,672,312 | 6/1987 | Takamine et al. | 324/158 F |

*Primary Examiner*—Stephen M. Baker
*Attorney, Agent, or Firm*—Paul R. Miller

[57] ABSTRACT

A testing apparatus for a high-frequency integrated circuit chip for transporting the high-frequency input-/output signals of this circuit by means of high-frequency lines of adapted characteristics impedance to measuring apparatus, is characterized in that it comprises:
  a first subassembly constituted by an insulating or dielectric substrate carrying on the one hand the integrated circuit chip fixed on one of its surfaces and on the other hand a network of high-frequency lines of the coplanar type formed on the same surface (designated as front surface) and arranged according to a geometric configuration suitable to transport the signals emitted by the inputs/outputs of the integrated circuit to the peripheral regions of the substrate, and a second subassembly for receiving the substrate provided with the integrated circuit and with the co-planar network with, this second subassembly further having means for producing a pressure on the mass regions of the coplanar network on a mass surface of this second subassembly and means for forming a good and reproducible contact between the central conductors of the coplanar network and the central conductors of the coaxial lines supplying the measuring apparatus.

10 Claims, 2 Drawing Sheets

TESTING APPARATUS FOR HIGH FREQUENCY INTEGRATED CIRCUIT CHIP

This is a continuation of application Ser. No. 944,923, filed Dec. 18, 1986, abandoned.

The invention relates to a testing apparatus for a high-frequency integrated circuit chip for transporting the input/output signals of this circuit by means of high-frequency lines of adapted characteristic impedance which are adapted to a measuring apparatus.

BACKGROUND OF THE INVENTION

The invention is used in the field of manufacture of high-frequency integrated circuits. During the manufacture or at the end of the manufacture of high-frequency integrated circuits, the chips carrying these circuits must have the possibility of being tested in a simple and especially very precise manner.

Now it is very difficult to carry out the test directly on the integrated circuit chip. On the other hand, in the field of high frequencies, it is not possible to transport the test signals through simple wires connected to the input/output contacts of the chip. The signals must imperatively be transported through high-frequency lines having a given characteristic impedance.

Therefore, the integrated circuit chip is positioned on an auxiliary support which comprises a plurality of high-frequency lines having a known impedance. The input/output contacts of the chip are connected to one of the ends of these lines, while the measuring apparatus intended to record the results of the tests are connected on the other end of these lines by means of conventional coaxial lines having an adapted characteristic impedance.

A testing apparatus for integrated circuits is known from U.S. Pat. No. 3,882,597. However, although this document clearly puts the problem of the contacts and connections between the circuit to be tested and the testing apparatus, it does not state any solution for testing a high-frequency circuit whose signals are transported by means of high-frequency lines.

More particularly this apparatus cannnot be adapted to the use of tests including high-frequency lines because the measurement could not be effected due to the fact that the coupling between the high-frequency lines used to connect the integrated circuit to the coaxial connectors connected to the measuring apparatus depends upon the pressure between the mass of the apparatus and the mass surfaces of the high-frequency lines. If the pressure of the measuring apparatus on the mass surfaces of the lines is not adequate, the coupling between these lines is too strong and the measurements are distorted.

SUMMARY OF THE INVENTION

Therefore, the invention provides a new testing apparatus used in the case described in the opening paragraph and permits a solution to this problem.

According to the invention, this problem is solved by means of an apparatus further characterized in that it comprises:
- a first subassembly constituted by an insulating or dielectric substrate carrying on the one hand the integrated circuit chip fixed on one of its surfaces and on the other hand a network of high-frequency lines of the coplanar type formed on the same surface (designated as front surface) and arranged according to a geometric configuration suitable to transport the signals emitted by the inputs/outputs of the integrated circuit to the peripheral regions of the substrate,
- a second subassembly for receiving the substrate provided with the integrated circuit and with the coplanar network with this second subassembly further having means for producing a pressure on the mass regions of the coplanar network on a mass surface of this second subassembly and means for forming a good and reproducible contact between the central conductors of the coplanar network and the central conductors of coaxial lines supplying the measuring apparatus.

According to the invention, this apparatus can further be characterized in that, for receiving the substrate provided with the integrated circuit and with the coplanar network, the second subassembly is mainly constituted by a so-called first part and by a so-called second part each having a flat polished surface with these surfaces being fixed opposite to each other, with a shoulder in such a manner that this shoulder constitutes a mass surface belonging to the first part suitable to be used as a recess for the substrate with the front surface of the substrate bearing on the flat and polished surface of the shoulder, in that the second subassembly comprises, for its use as a recess for the coaxial connectors of the high-frequency lines supplying the measuring apparatus, circular openings, which are provided in the first and second parts and in a number equal to that of the coplanar lines, distributed along the periphery of the first and second parts according to a suitable geometry, and in that each central conductor of a coaxial connector is caused to coincide with an end of a central conductor of coplanar lines so that, due to the position of these openings, only the mass regions of the coplanar lines bear on the shoulder serving as mass, while the central conductors of the coplanar lines bear on the central conductors of the coaxial conductors.

The testing apparatus according to the invention therefore has numerous advantages, inter alia:
- an excellent mass contact along the entire periphery of the substrate carrying the coplanar lines,
- a continuity of characteristic impedance between the central conductor of the coplanar lines and the central conductor of the coaxial lines ensuring the connection between the coplanar line and the measuring apparatus,
- a good and reproducible contact between the central conductor of the coplanar line and the central conductor of the coaxial line,
- a high convenience in use, an easy loading and unloading of the substrate comprising the coplanar lines and the integrated circuit to be tested, and a good reproducibility of the electrical connections,
- a manner of carrying out the test which is simple and whose cost is reduced so that it will not increase the manufacturing cost of the integrated circuit, and
- finally, an extremely high precision with respect to the tests because the latter are carried out directly on the integrated circuit chips at a stage of the manufacture at which the chip is not yet provided with an envelope.

This enables manufacture of high-frequency integrated circuits operating in the range of 10–18 GHz.

BRIEF DESCRIPTION OF THE DRAWINGS

In order that the invention may be readily carried out, it will now be described more fully with reference to the accompanying drawings, in which.

DESCRIPTION OF THE PREFERRED EMBODIMENTS

The testing apparatus according to the invention therefore comprises two subassemblies.

Figure 1:
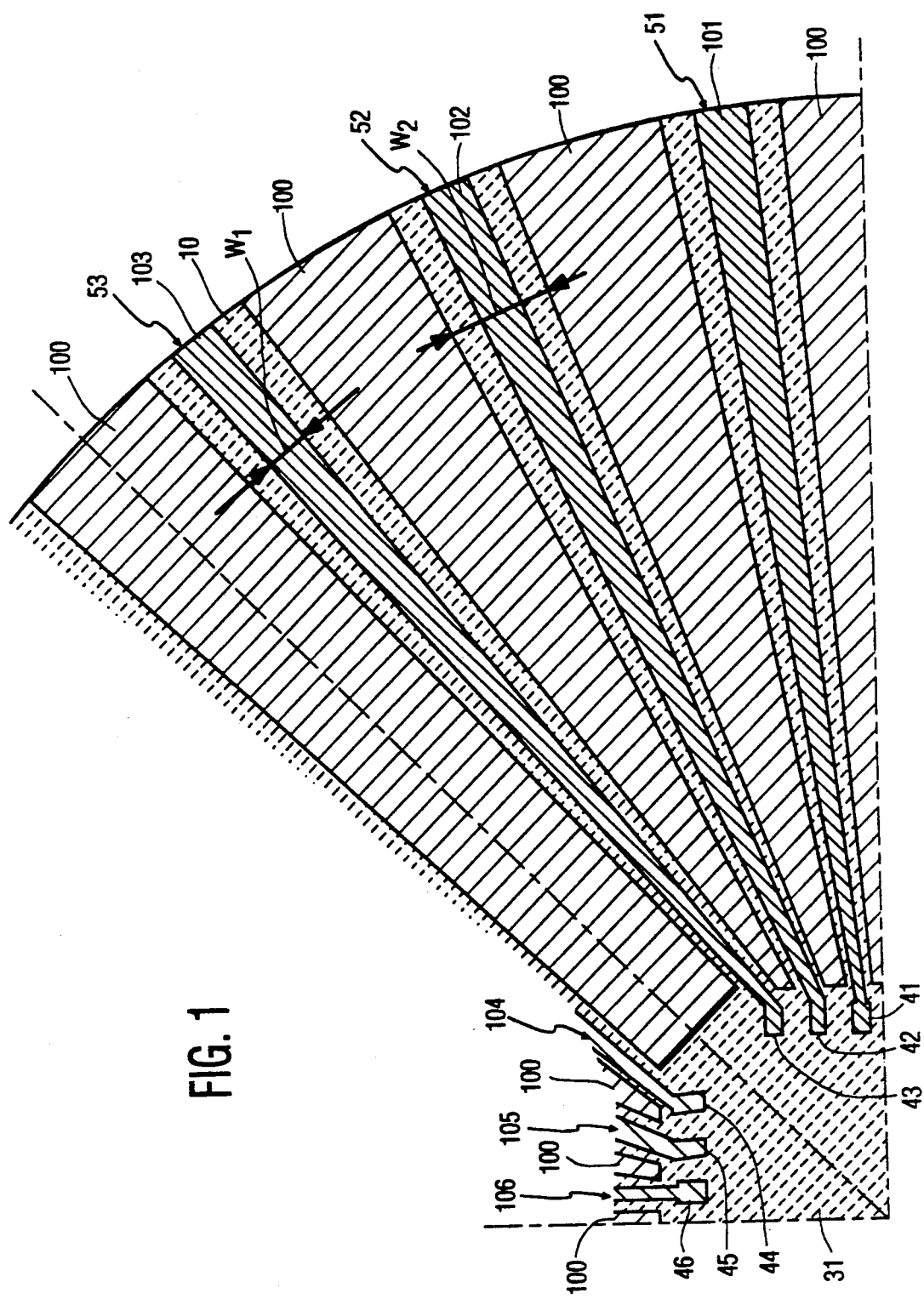
FIG. 1 shows an embodiment of coplanar lines on an auxiliary support with this figure showing about one eight of the support viewed from above.

The first subassembly shown in FIG. 1 is constituted by an auxiliary support 10 of, for example, alumina, on one of whose surfaces 11 are formed high-frequency lines of the coplanar type in a number equal to the number of the inputs/outputs to be tested of an integrated circuit chip, which is disposed in the zone 31 of this surface 11. This auxiliary support, which is designated as substrate 10, may be of square as well as of circular form. In practice, a person skilled in the art will readily adopt the square form when the substrate 10 comprises a number of lines smaller than 10 and the circular form when the number of lines exceeds 10. However, this limit value is not imperative at all and the choice is solely left to the user.

On the contrary, the high-frequency lines 101, 102 etc. formed on the substrate 10 are preferably chosen to be of the so-called coplanar type.

The term "coplanar lines" is to be understood to mean lines in the form of metallized tapes having a width $W_1$ lying between two large metallized surfaces 100 constituting the mass. The metallized tape constitutes the central conductor of the line with the mass surfaces being mutually separated by a distance $W_2$. Moreover, the tape constituting the central conductor and the mass surfaces are obtained on the same surface 11 of the substrate 10. In these conditions, the characteristic impedance of such a high-frequency line depends only upon the ratio $W_1/W_2$.

This embodiment of a high-frequency line is of great importance.

In the first place, due to the fact that the central conductors and the mass are formed on the same surface of the substrate, the connections between the integrated circuit disposed in the zone 31 and these lines can be directly obtained without using, as in the so-called tri-wafer or bifilar technologies, metallized holes allowing the passage of the connections from one surface to the other surface of the substrate, which in these technologies is provided with metallizations at its two surfaces. This is very advantageous because the connections through metallized holes leads to a given failure percentage in the electrical branches.

In the second place, due to the fact that the impedance only depends upon the ratio $W_1/W_2$ and does not depend as in the other aforementioned technologies, upon the ratio $W/e$, where W is the width of the central conductor tape and e is the thickness of the dielectric, it is easy according to the technology of coplanar lines to form lines having a current impedance, such as, for example, 50 Ω, even with narrow lines. Consequently, it is easy to form by means of this technology a large number of lines having a desired impedance, such as, for example, 50 Ω, in the immediate proximity of an integrated circuit chip, as shown in FIG. 1. The input/output contacts of this chip are connected by means of a method according to the choice of a person skilled in the art to the terminals 41,42,43,44,45,46 etc. of the lines 101,102,103,104,105,106 etc. with the integrated circuit chip being disposed in the zone 31.

The configuration of lines shown in FIG. 1 is given of course only by way of example. Numerous other configurations are possible which are adapted to the form and the dimensions of the integrated circuit chip and the number of inputs/outputs.

The test of the inputs/outputs of the integrated circuit chip will be carried out by means of the lines formed on the auxiliary support 10 at the ends 51,52,53 etc. of the respective lines 101,102,103 etc.

For this purpose, the apparatus according to the invention comprises a second subassembly which permits forming reliable and reproducible contacts on these lines 101,102,103 etc. by means of conventional coaxial lines supplying the signals to the measuring apparatus.

Figure 2:
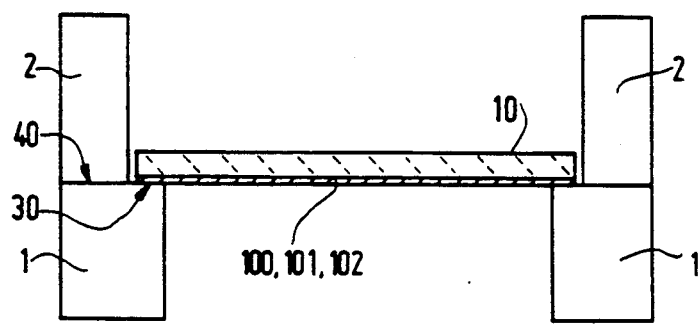
FIG. 2 is a sectional view of the testing apparatus according to the inventon in simplified form.

This second subassembly is shown in simplified form in FIG. 2. It comprises main parts bearing one on the other and designated by 1 and 2, which, by way of example, may be concentric and, when the substrate 10 is circular, may constitute bodies of revolution.

The most important portions of these two parts are the flat surface 30 of the part 1 and the flat surface 40 of the part 2.

The surfaces 30 and 40 are machined with a high precision both with respect to flatness and with respect to the state of the surface which will be polished. These surfaces are then disposed adjacent to each other.

The inner diameter of the part 1 is chosen to exceed the inner diameter of the part 2 so that a portion of the surface 30 is thus available to receive the surface 11 of the substrate 10 provided with the integrated circuit chip connected to the lines and to the masses in a suitable manner.

Recesses or openings 25 are formed in the part 1 and recesses or openings 26 are formed opposite thereto in the part 2 so as to coincide with the portions of the surface 11 which carry the central conductors 101,102,103 etc.

Coaxial lines 4 of the conventional type then extend in these recesses 25, 26 between the parts 1 and 2 and are thus moved toward and to the proximity of the central conductors 101,102 etc.

The recesses 25, 26 formed in the parts 1 and 2 are made with such a precision that the coaxial lines 4 are positioned in these recesses with a high lateral precision.

Figure 3:
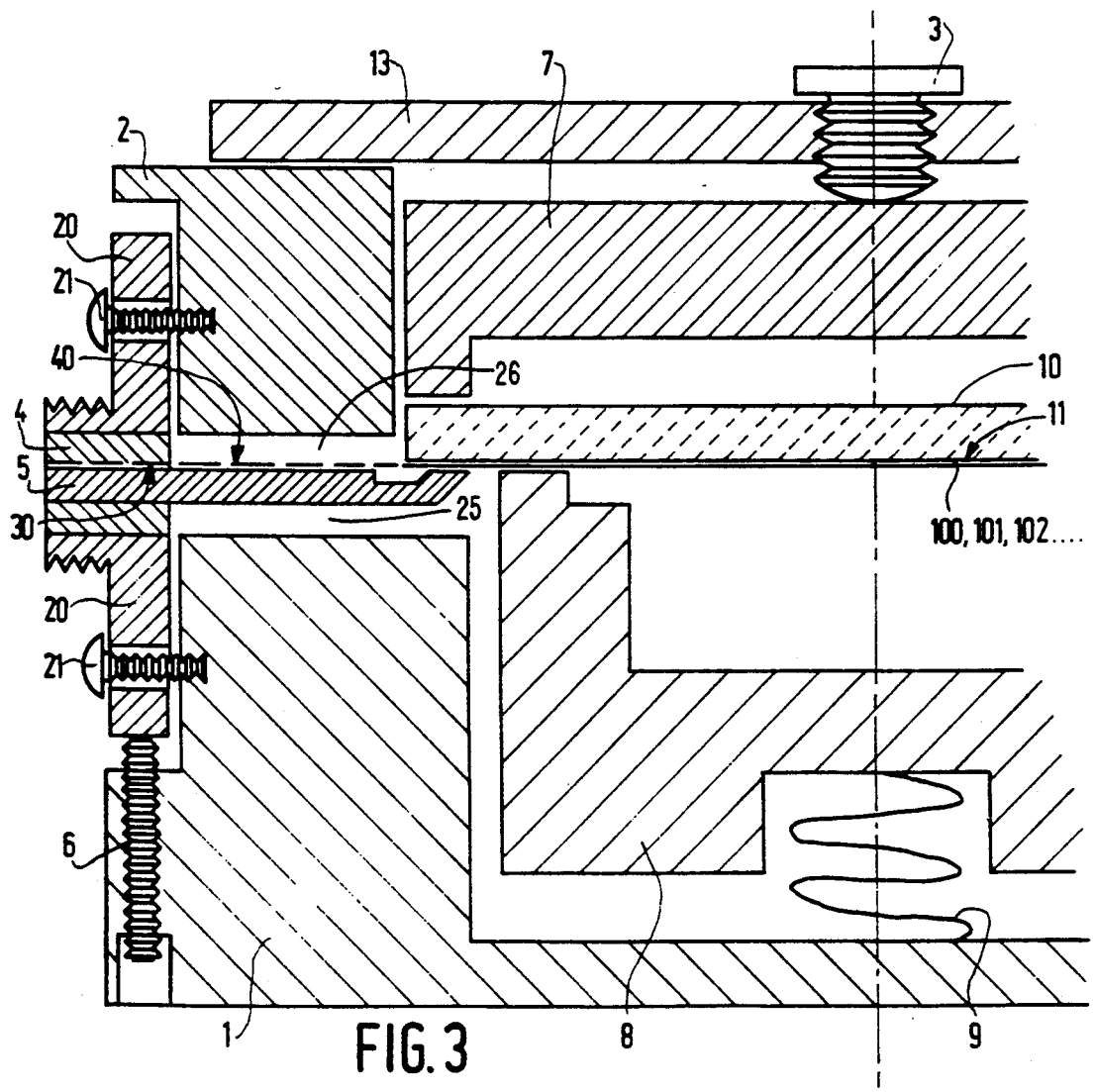
FIG. 3 is a sectional view of the testing apparatus according to the invention in greater detail.

FIG. 3 shows this arrangement in greater detail. A certain freedom of control is left for the coaxial lines 4 in the transverse positioning.

The coaxial lines 4, whose central conductor is denoted by reference numeral 5, are held opposite to the parts 1 and 2 by the support 20 and the screws 21.

The positioning at right angles to the front surface of the substrate of the central conductors 5 of the coaxial lines (or connectors) 4 is ensured in a precise manner by the screw 6 which permits adjusting the pressure of the central conductor 5 on the line 101 or 102 etc. carried by the surface 11 due to the natural elastic deformation of the conductor 5. This control has to be effected once during the first use of the apparatus.

In the test position, the surface 11 of the substrate 10 is pressed against the surface 30 of the part 1 by a part 7 having a low dielectric constant. This part 7 may consist, for example, of plexi-glass.

The material chosen to form the part 7 must necessarily have a low dielectric constant in order to avoid capacitive couplings. It should be noted that in this case high-frequency measurements by means of high-frequency lines are concerned, which leads to particularities of the testing apparatus according to the invention which do not appear in the known testing apparatus according to the prior art.

The part 7 moreover has a central recess in such a manner that the pressure exerted by the part 7 is exerted on the substrate only at the area opposite to the part of the surface 30 on which bears the surface 11.

Finally, a part 8, like the part 7, must be insulating for the reasons mentioned above, freely slides in the part 1 and will press the active side 11 of the substrate 10 by a spring 9 in such a manner that the substrate 10 is pressed towards the part 7.

The method of using the testing apparatus according to the invention consequently comprises the following steps:
- positioning the integrated circuit chip in the zone 31 on the surface 11 of the substrate 10 carrying coplanar lines 101,102,103 etc. and mass regions 100, connecting the input/output contacts of the integrated circuit to the ends 41,42,43 etc. of the central conductors of the coplanar lines,
- positioning the substrate 10 in such a manner that the surface 11 is arranged adjacent to the part 8 so that the central conductors are situated adjacent to the recesses 25, 26 and the mass regions 100 are situated adjacent to the surface 30 of the part 1,
- causing the central conductors 101,102 etc. to coincide with the central conductors 5 of the coaxial lines 4, and
- positioning the part 7 which will press by means of the screw 3 the substrate 10 on the surface 30 by compressing the spring 9 until the electrical contacts between the conductors 5 and the high-frequency lines 101,102 . . . etc. are established as well as between the metallized zones 100 and the metallic surface 30. The pressure between these different parts is found to be ideal when, while measuring the high-frequency coupling between two coplanar lines, the value of this coupling is found to be a minimum. The clamping force cannot be eliminated before this minimum coupling has been obtained, but it must not be maintained either thereafter any longer because otherwise the substrate 10 is liable to break.

In the embodiment shown in FIG. 3, a simple system comprising a bracket 13 and a screw 3 permits producing this clamping force with the precision which must imperatively be obtained because the precision of the measurements and their repeatability ultimately depends upon this clamping force.

It should be noted that the bracket 13 and the parts 1 and 2 can be fixed to each other by a blocking system not shown for the sake of simplicity of the drawing. This blocking system may be obtained, for example, by screws.

Also in an embodiment of the apparatus, the bodies 1 and 2 may be made of bronze.

The surfaces 30 and 40 are then gold plated in order to ensure reproducible electrical contacts.

The coaxial connectors 4 are, for example, of the truncated type, for example, of the registered trademark RADIALL, used in known manner for connection with lines of the bifilar or triwafer micro-ribbon type.

The precise positioning of the coaxial lines is finally ensured by the following operations:
- the coaxial connectors 4 are positioned by means of parts 20 and screws 21 in a loose manner;
- a reference substrate 10, whose surface 11 is entirely metallized, for example by gold-plating, is positioned on the body 1 and is clamped by means of the screw 3 to press the surface 11 on the surface 30. The height of each central conductor 5 is then adjusted by means of its vertical regulation screw 6 until there is an electrical contact between the central conductor 5 of the coaxial line and the entirely metallized surface 11. The central conductor 5 is then in contact with the mass potential because the metallized surface 11 is otherwise in contact with the surface 30 constituting the mass; and
- the pressure of the central conductor 5 on the metallized surface 11 of the reference substrate is then slightly increased with respect to the position in which the contact is just obtained. By way of example, this slight increase of the pressure can be obtained by turning the screw 6 so that it is advanced over a distance of about 0.2 mm. The central conductor is then in the bent state. This bent state ensures that a pressure of a few hundred grams is produced, which permits obtaining a reproducible contact.

This operation of preliminarily controlling the pressure of the central conductors 5 of the coaxial measurement lines 4 is effected by means of this reference substrate 10 on all the central conductors used in the apparatus.

The testing apparatus according to the invention consequently permits establishing the connection between the integrated circuit to be tested and the coaxial measurement lines which supply the signals to the measuring apparatus with all the advantages already mentioned.

The mass contact is excellent due to the fact that the mass surface 30 is formed with a high precision with respect to flatness. This precision with respect to flatness of the surface 30 can be obtained due to the fact that the assembly of the surface 30 is subjected to a machining operation and to a polishing operation and it is not a single crown in the form of a shoulder of the parts 1 and 2 that is subjected to these operations, as could appear to be sufficient, which could be obtained only by a less precise machining operation if the parts 1 and 2 should form an integral part.

Finally, the assembly of the apparatus can be easily used for assembling, and also for disassembling, because in this case it is not necessary at all to readjust the control of the central conductors 5 and the spring 9 pushes the subtrate 10 back to the output of the apparatus.

What is claimed is:
1. A testing apparatus for testing high-frequency integrated circuit chips comprising
   a substrate having a space for an integrated circuit chip structure on one surface of said substrate, said substrate being an insulating or dielectric material,
   a network of high-frequency lines disposed on said one surface of said substrate, said network extending in a geometric configuration from said space to a peripheral region of said substrate, structural means having a surface for receiving said substrate and said network, said structural means including first means for producing pressure between said peripheral region of said substrate and said surface of said structural means, and a plurality of coaxial conductor means attached to said structural means for providing electrical contact to said network of high-frequency lines, wherein said structural means includes a structural part and a second structural part, said first and second structural parts including a central opening in which said substrate is disposed relatively between said first and second structural parts, wherein each of said first structural part and said second structural part have one flat polished surface, said flat polished surface of said first structural part being disposed in facing relationship to said flat polished surface of said second structural part, said flat polished surface of said first structural part ex tending further into said opening than said flat polished surface of said second structural part to form a shoulder, said shoulder being said surface of said structural means, said substrate disposed on said shoulder with said one surface of said substrate bearing on said flat polished surface of said shoulder, wherein said structural means includes a plurality of openings through both said first and second structural parts at said flat polished surfaces, said plurality of coaxial conductor means extending through said openings to provide central conductors to be coupled to respective high-frequency lines of said network, said plurality of openings being distributed along a periphery of said structural means, and wherein said substrate bears on said shoulder while said high-frequency lines coincide with ends of said central conductors.

2. A testing apparatus according to claim 1, wherein said substrate is circular.

3. A testing apparatus according to claim 2, wherein said first and second structural parts are bodies of revolution.

4. A testing apparatus according to claim 1, wherein said first means includes a third structural part of a rigid dielectric material, said third structural part having a peripheral portion extending against a second surface of said substrate, and second means applied against said third structural part for exerting pressure to said third part onto said second surface of said substrate.

5. A testing apparatus according to claim 4, wherein said first means also includes a fourth structural part having a peripheral portion extending against said peripheral portion of said one surface of said substrate, and a spring bearing against said fourth structural part to urge said substrate against said peripheral portion of said third structural part.

6. A testing apparatus according to claim 4, wherein said plurality of coaxial conductor means are attached to said structural means by clamping means for clamping said coaxial conductor means to said structural means, said clamping means enabling said central conductors to maintain a flexed pressure on said high-frequency lines of said network.

7. A testing apparatus according to claim 15, wherein said clamping means include screws turning in said first structural part, said screws having tips bearing on said plurality of coaxial conductor means to provide said flexed pressure.

8. A testing apparatus according to claim 1, wherein said first and second structural parts are bronze, and wherein said flat polished surfaces are gold-plated.

9. A testing apparatus according to claim 1, wherein said substrate is a ceramic material.

10. A testing apparatus according to claim 9, wherein said ceramic material is alumina.

* * * * *